(12) United States Patent
Cheng et al.

(10) Patent No.: US 9,711,617 B2
(45) Date of Patent: Jul. 18, 2017

(54) DUAL ISOLATION FIN AND METHOD OF MAKING

(71) Applicant: International Business Machines Corporation, Armonk, NY (US)

(72) Inventors: Cheng-Wei Cheng, White Plains, NY (US); Sanghoon Lee, White Plains, NY (US); Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/963,446

(22) Filed: Dec. 9, 2015

(65) Prior Publication Data

US 2017/0170297 A1    Jun. 15, 2017

(51) Int. Cl.
  *H01L 29/66*    (2006.01)
  *H01L 21/02*    (2006.01)
  *H01L 29/20*    (2006.01)
  *H01L 21/308*   (2006.01)
  *H01L 29/78*    (2006.01)
  *H01L 21/762*   (2006.01)
  *H01L 29/06*    (2006.01)

(52) U.S. Cl.
  CPC .. *H01L 29/66522* (2013.01); *H01L 21/02381* (2013.01); *H01L 21/02538* (2013.01); *H01L 21/02639* (2013.01); *H01L 21/308* (2013.01); *H01L 21/762* (2013.01); *H01L 29/0649* (2013.01); *H01L 29/20* (2013.01); *H01L 29/66795* (2013.01); *H01L 29/7851* (2013.01)

(58) Field of Classification Search
  CPC ......... H01L 29/66522; H01L 21/02639; H01L 29/20; H01L 21/02381; H01L 21/308; H01L 29/7851; H01L 29/66795; H01L 21/762; H01L 29/0649; H01L 21/02538
  See application file for complete search history.

(56) References Cited

U.S. PATENT DOCUMENTS

| | | | |
|---|---|---|---|
| 8,497,177 B1* | 7/2013 | Chang ............... | H01L 29/66795 438/283 |
| 2010/0163926 A1* | 7/2010 | Hudait ............... | H01L 29/1054 257/190 |
| 2014/0353752 A1* | 12/2014 | Cheng ............... | H01L 29/785 257/347 |
| 2016/0240386 A1* | 8/2016 | Syun ............... | H01L 21/0206 |

* cited by examiner

*Primary Examiner* — Steven Loke
*Assistant Examiner* — Juanita Rhodes
(74) *Attorney, Agent, or Firm* — Cantor Colburn LLP; Louis Percello

(57) ABSTRACT

A method of making a dual isolation fin comprises applying a mask to a substrate and etching the exposed areas of the substrate to form a mandrel; forming a dielectric layer on the surface of the substrate and adjacent to the mandrel; forming a first epitaxially formed material on the exposed portions of the mandrel; forming a second epitaxially formed material on the first epitaxially formed material; forming a first isolation layer on the dielectric layer and adjacent to the second epitaxially formed material; removing the mask and mandrel after forming the first isolation layer; removing the first epitaxially formed material after removing the mask and mandrel; and forming a second isolation layer.

16 Claims, 8 Drawing Sheets

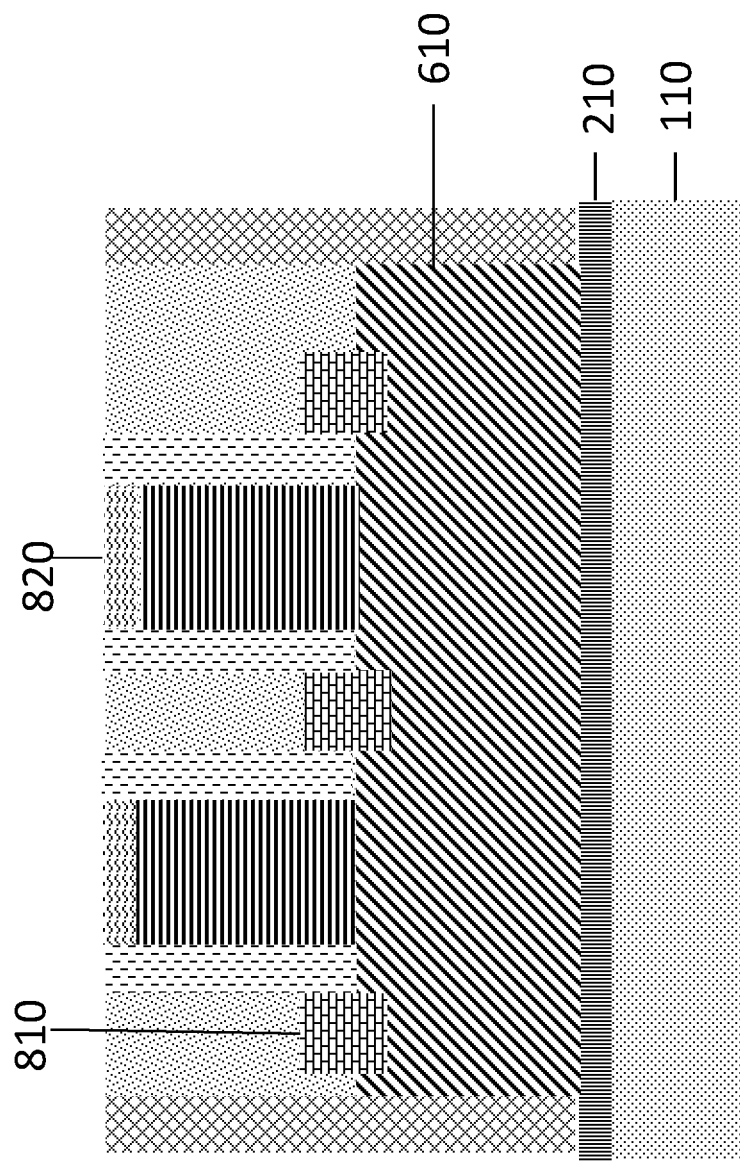

DUAL ISOLATION FIN AND METHOD OF MAKING

BACKGROUND

The present invention generally relates to metal-oxide-semiconductor field-effect transistors (MOSFET) and more specifically to fin-type field effect transistors.

The MOSFET is a transistor used for amplifying or switching electronic signals. The MOSFET has source, a drain and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the pay from drain to source is an open circuit ("of") or a resistive path ("on").

N-type field effect transistors (NFET) and p-type field effect transistors (PFET) are two types of complementary MOSFETs. The NFET uses electrons as the majority current carriers and is built directly in a p substrate with n-doped source and drain junctions. The PFET uses holes as the majority current carriers and is built in an n-well with p-doped source and drain junctions.

The fin-type field effect transistor (FinFET) is a type of MOSFET. The FinFET contains a conformal gate around the fin that mitigates the effects of short channels and reduces drain-induced barrier lowering. The "fin" refers to the narrow channel between source and drain regions. A thin insulating high-k gate oxide layer around the fin separates the fin channel from the gate metal.

SUMMARY

Described herein is a method of making a dual isolation fin comprising: applying a mask to portions of a substrate and etching the exposed areas of the substrate to form a mandrel; forming a dielectric layer disposed on the surface of the substrate and adjacent to the mandrel; forming a first epitaxially formed material on the mandrel; forming a second epitaxially formed material on first epitaxially formed material; forming a first isolation layer on top of the dielectric layer and adjacent to the second epitaxially formed material; removing the mask and mandrel after forming the first isolation layer to form an open area of the substrate; removing the first epitaxially formed material after removing the mask and mandrel; and forming a second isolation layer in the open area of the substrate.

Described herein is a method of making a dual isolation fin comprising: applying a mask to portions of a substrate comprising silicon and etching the exposed areas of the substrate to form a mandrel; forming a dielectric layer disposed on the surface of the substrate and adjacent to the mandrel; forming a first epitaxially formed material comprising a first III-V material on the exposed portions of the mandrel; forming a second epitaxially formed material comprising a second III-V material on the first epitaxially formed material; forming a first isolation layer on top of the dielectric layer and adjacent to the second epitaxially formed material; removing the mask and mandrel after forming the first isolation layer to form an open area of the substrate; removing the first epitaxially formed material after removing the mask and mandrel; and forming a second isolation layer in the open area of the substrate, wherein the first III-V material has a lattice constant greater than the lattice constant of silicon and less than the lattice constant of the second III-V material.

Also described herein is a semiconductor device comprising: a substrate and a mandrel; a dielectric layer disposed on the surface of the substrate and adjacent to the mandrel; a first epitaxially formed material disposed on a portion of the dielectric layer and adjacent to the mandrel; a second epitaxially formed material disposed on a portion of the dielectric layer and adjacent to the first epitaxially formed material; and a first isolation layer disposed on top of the surface of the dielectric layer and adjacent to the second epitaxially formed material.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing features are apparent from the following detailed description taken in conjunction with the accompanying drawings in which:

FIG. 8 shows a completed semiconductor device.

DETAILED DESCRIPTION

Described herein is method of making a dual isolation fin. The method utilizes a first epitaxially formed material as a sacrificial material, allowing the formation of a high quality fin comprising a material different from the substrate or mandrel. The first epitaxially formed material is removed prior to completion of the device. The first epitaxially formed material has a lattice constant which is intermediate of the lattice constant of the mandrel and the lattice constant of the second epitaxially formed material. Utilizing the first epitaxially formed material allows the formation of a high quality fin with fewer defects.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2 or 1% of the reported numerical value.

Figure 1:
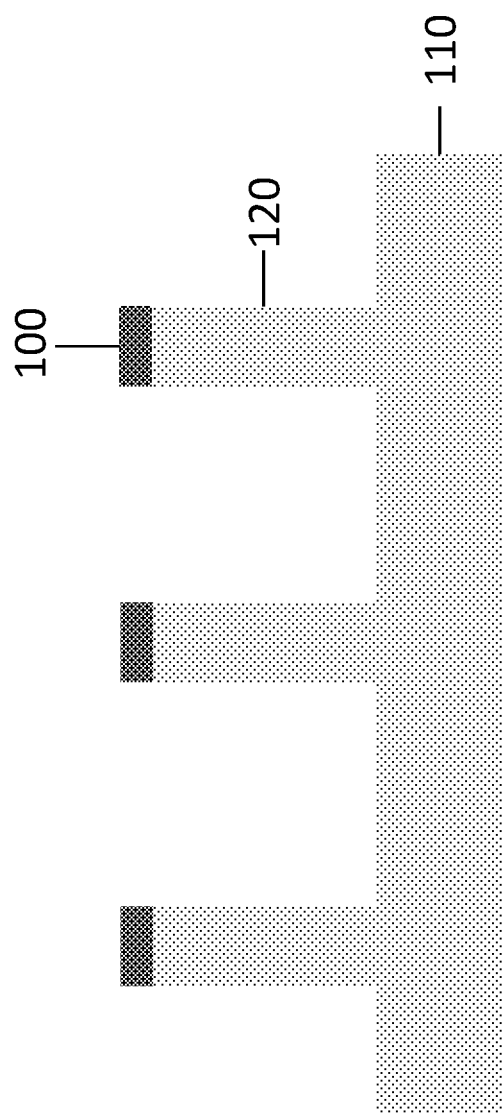
FIG. 1 shows a structure having mandrels topped by a mask.

With reference now to FIG. 1, a mask 100 is applied to a portion of a substrate 110 and then a portion of the unmasked substrate is removed to form a mandrel 120. The mandrel can have a height of 50 to 200 nanometers (nm). The mask comprises, for example, silicon oxide, silicon nitride (SiN), silicon oxide carbide nitride (SiOCN), silicon boride carbide nitride (SiBCN) or a combination comprising one or more of the foregoing. The mask can be deposited using chemical vapor deposition (CVD) or any other suitable process. The substrate comprises a crystalline material suitable as a template for epitaxial growth. Exemplary materials include silicon, silicon germanium, III-V semiconductors, II-VI semiconductors or a combination comprising at least one of the foregoing. As used herein, the term "III-V semiconductor" denotes a semiconductor material that includes at least one element from Group III of the Periodic Table of Elements (B, Al, Ga, In) and at least one element from Group V of the Periodic Table of Elements (N, P, As, Sb, Bi). Typically, the III-V semiconductors may be binary alloys, ternary alloys, or quaternary alloys, of III-V elements. Examples of III-V semiconductors include, but are not limited to GaAs, InAs, InP, InGaAs, InAlAs, InAlAsSb, InAlAsP, AlInGaP, InGaAsP, and alloys thereof. As used herein, the term "II-VI semiconductor" denotes a semiconductor material that includes at least one element from Group II of the Periodic Table of Elements (Zn, Cd, Hg) and at least one element from Group VI of the Periodic Table of Elements (O, S, Se, Te, Po). Typically, the III-V semiconductors may be binary alloys, ternary alloys, or quaternary alloys, of III-V elements. Examples of II-VI semiconductors include, but are not limited to ZnSe, ZnS, ZnTe, CdZnTe, HgCdTe, HgZnTe, HgZnSe, and alloys thereof.

Figure 2:
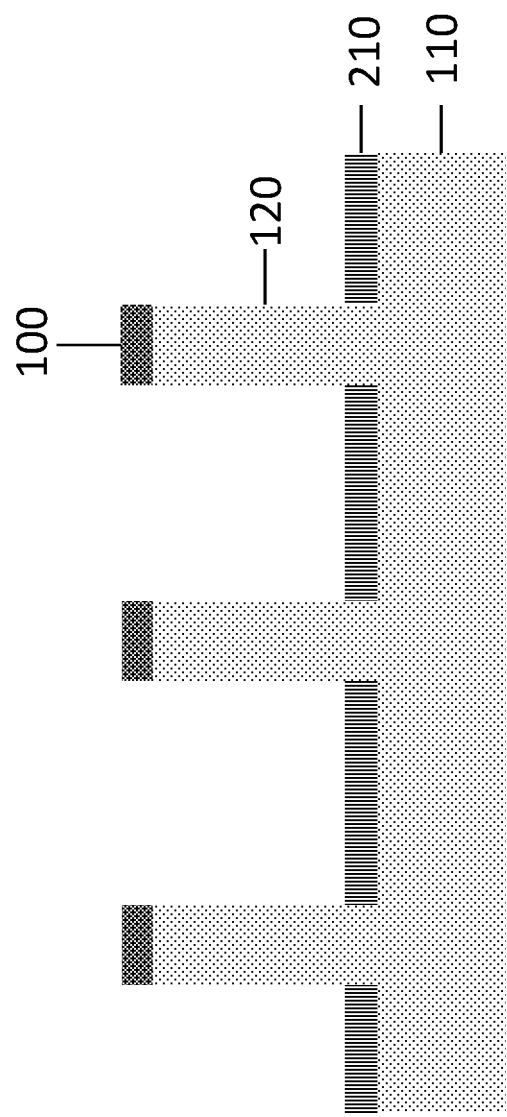
FIG. 2 shows the structure of FIG. 1 after formation of a dielectric layer.

A dielectric material is then deposited over the substrate, mandrel and mask. The dielectric is planarized by chemical mechanical planarization (CMP) and then dielectric is removed to form a dielectric layer (210) having a thickness of 30 to 100 nanometers as shown in FIG. 2. The dielectric layer has a thickness which is less than the height of the mandrel.

Exemplary dielectric materials include, but are not limited to, spin-on glass, oxides, nitrides, oxynitrides, silicates (e.g., metal silicates), aluminates, titanates, nitrides or any combination thereof. More specific examples of dielectric materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof.

The dielectric material is deposited by one or more known methods such as thermal oxidation, physical vapor deposition (PVD), plasma enhanced chemical vapor deposition (PECVD), microwave enhanced chemical vapor deposition (MECVD), chemical vapor deposition (CVD), electrochemical deposition (ECD), molecular beam epitaxy (MBE) and more recently, atomic layer deposition (ALD), e-beam evaporation, sputtering, or a combination comprising one or more of the foregoing.

A first epitaxially formed material is formed on the sides of the mandrel above the dielectric layer. The first epitaxially formed material can be formed by heteroepitaxy. As used herein, "epitaxy" refers to the deposition of a crystalline overlayer on a crystalline substrate, while "heteroepitaxy" refers specifically to epitaxy performed with materials that are different from each other. Heteroepitaxy implies that although the materials and crystal structures may not be identical, the crystal structures are related, with the substrate or underlying layer templating the crystal structure of the overlayer.

Methods for heteroepitaxial growth of the first epitaxially formed material include heteroepitaxial lateral overgrowth (ELOG), metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor phase epitaxy (Cl-VPE), or liquid phase epitaxy (LPE).

Exemplary first epitaxially formed materials include silicon, silicon germanium, III-V semiconductors, II-VI semiconductors or a combination comprising at least one of the foregoing. As used herein, the term "III-V semiconductor" denotes a semiconductor material that includes at least one element from Group III of the Periodic Table of Elements (B, Al, Ga, In) and at least one element from Group V of the Periodic Table of Elements (N, P, As, Sb, Bi). Typically, the III-V semiconductors may be binary alloys, ternary alloys, or quaternary alloys, of III-V elements. Examples of III-V semiconductors include, but are not limited to GaAs, InAs, InP, InGaAs, InAlAs, InAlAsSb, InAlAsP, AlInGaP, InGaAsP, and alloys thereof. As used herein, the term "II-VI semiconductor" denotes a semiconductor material that includes at least one element from Group II of the Periodic Table of Elements (Zn, Cd, Hg) and at least one element from Group VI of the Periodic Table of Elements (O, S, Se, Te, Po). Typically, the III-V semiconductors may be binary alloys, ternary alloys, or quaternary alloys, of III-V elements. Examples of II-VI semiconductors include, but are not limited to ZnSe, ZnS, ZnTe, CdZnTe, HgCdTe, HgZnTe, HgZnSe and alloys thereof.

The first epitaxially formed material is chosen to have a lattice constant between the lattice constant of the mandrel material (which is the same as the substrate) and the lattice constant of the second epitaxially formed material which is formed adjacent to the first epitaxially formed material. The first epitaxially formed material is different from the second epitaxially formed material. In addition the first epitaxially formed material must be able to be removed without altering or damaging the second epitaxially formed material. The thickness of the first epitaxially formed material can be limited in order to minimize the number of defects in the crystal structure of the first epitaxially formed material. Defects in the crystal structure of the first epitaxially formed material can be transferred (or translated) to the second epitaxially formed material. The second epitaxially formed material is formed by heteroepitaxy. The second epitaxially formed material can have a thickness less than or equal to 30 nanometers, or, more specifically, a thickness of 3 to 10 nanometers. The thickness of the second epitaxially formed material is equivalent to the maximum width of the fin in the semiconductor device.

Exemplary second epitaxially formed materials include silicon, silicon germanium, III-V semiconductors, II-VI semiconductors or a combination comprising at least one of the foregoing. As used herein, the term "III-V semiconductor" denotes a semiconductor material that includes at least one element from Group III of the Periodic Table of Elements (B, Al, Ga, In) and at least one element from Group V of the Periodic Table of Elements (N, P, As, Sb, Bi). Typically, the III-V semiconductors may be binary alloys, ternary alloys, or quaternary alloys, of III-V elements. Examples of III-V semiconductors include, but are not limited to GaAs, InAs, InP, InGaAs, InAlAs, InAlAsSb, InAlAsP, AlInGaP, InGaAsP, and alloys thereof. As used herein, the term "II-VI semiconductor" denotes a semiconductor material that includes at least one element from Group II of the Periodic Table of Elements (Zn, Cd, Hg) and at least one element from Group VI of the Periodic Table of Elements (O, S, Se, Te, Po). Typically, the III-V semiconductors may be binary alloys, ternary alloys, or quaternary alloys, of III-V elements. Examples of II-VI semiconductors include, but are not limited to ZnSe, ZnS, ZnTe, CdZnTe, HgCdTe, HgZnTe, HgZnSe, and alloys thereof.

Methods for heteroepitaxial growth of the second epitaxially formed material include heteroepitaxial lateral overgrowth (ELOG), metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor phase epitaxy (Cl-VPE), or liquid phase epitaxy (LPE).

As mentioned above, the first epitaxially formed material has a lattice constant intermediate of the lattice constant of the mandrel material (the substrate material) and the second epitaxially formed material. An exemplary combination is a mandrel composed of silicon, a first epitaxially formed material composed of indium phosphide (InP) and a second epitaxially formed material composed of indium gallium arsenide. Another exemplary combination is a mandrel composed of silicon, a first epitaxially formed material composed of aluminum arsenide (AlAs) and a second epitaxially formed material composed of indium gallium arsenide.

Figure 3:
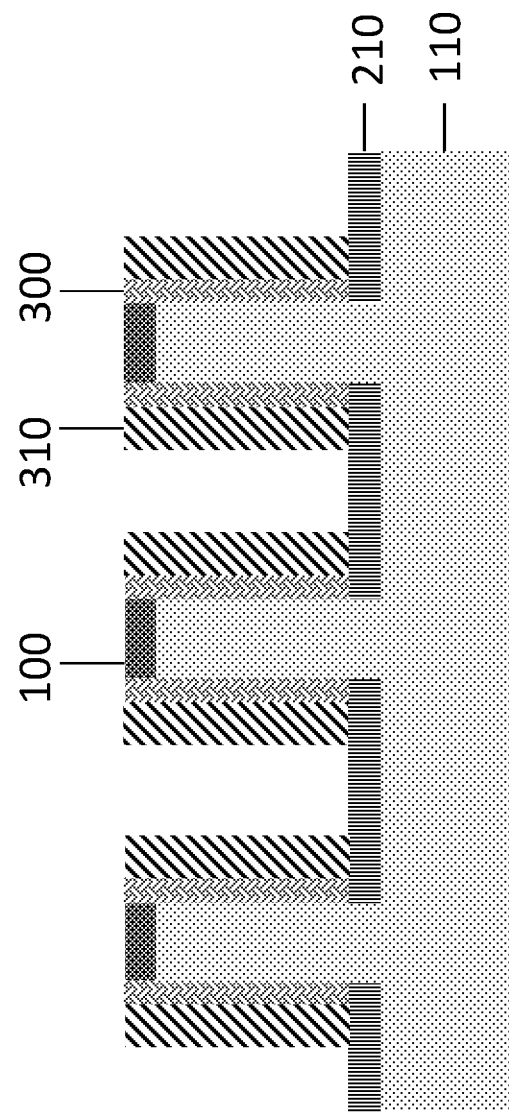
FIG. 3 shows the structure of FIG. 2 after the formation of the first epitaxially formed material and the second epitaxially formed material.

Turning now to FIG. 3, the structure has a substrate 110. The dielectric layer 210 is located on top of the substrate and adjacent to the mandrel 120. The mask 100 is located on top of the mandrel 120. The mask 100 is located on top of the mandrel 120. The first epitaxially formed material 300 is grown on an exposed portion of the mandrel 120. The second epitaxially formed material 310 is grown on the first epitaxially formed material.

Figure 4:
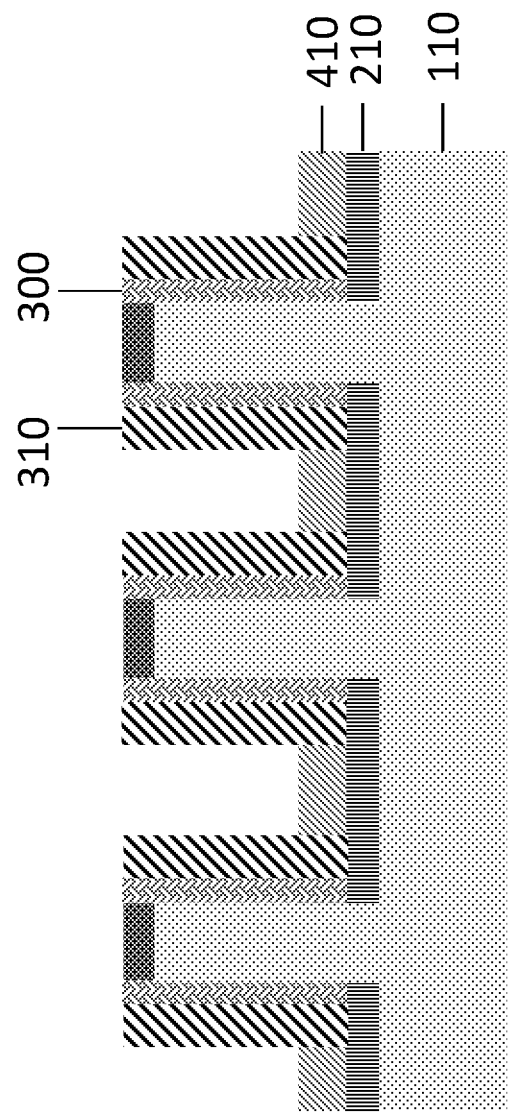
FIG. 4 shows the structure of FIG. 3 after the formation of the first isolation layer.

Following the formation of the second epitaxially formed material 310 a first isolation material is deposited over the structure. The first isolation material is planarized and the material between the second epitaxially formed materials is removed to form the first isolation layer and result in the structure shown in FIG. 4. FIG. 4 shows the first isolation layer 410 disposed on top of and parallel with the dielectric layer 210 and adjacent to the second epitaxially formed material 310. In some embodiments first isolation layer can have a thickness of 10 to 30 nanometers. In some embodiments the first isolation layer has a thickness less than the height of the second epitaxially formed material. In some embodiments the first isolation layer has a thickness equal to the height of the second epitaxially formed material.

Exemplary first isolation layer materials include, but are not limited to, spin-on glass, oxides, nitrides, oxynitrides, silicates (e.g., metal silicates), aluminates, titanates, nitrides, or any combination thereof. More specific examples of dielectric materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof.

The first isolation layer and the dielectric material can comprise the same or different materials.

Figure 5:
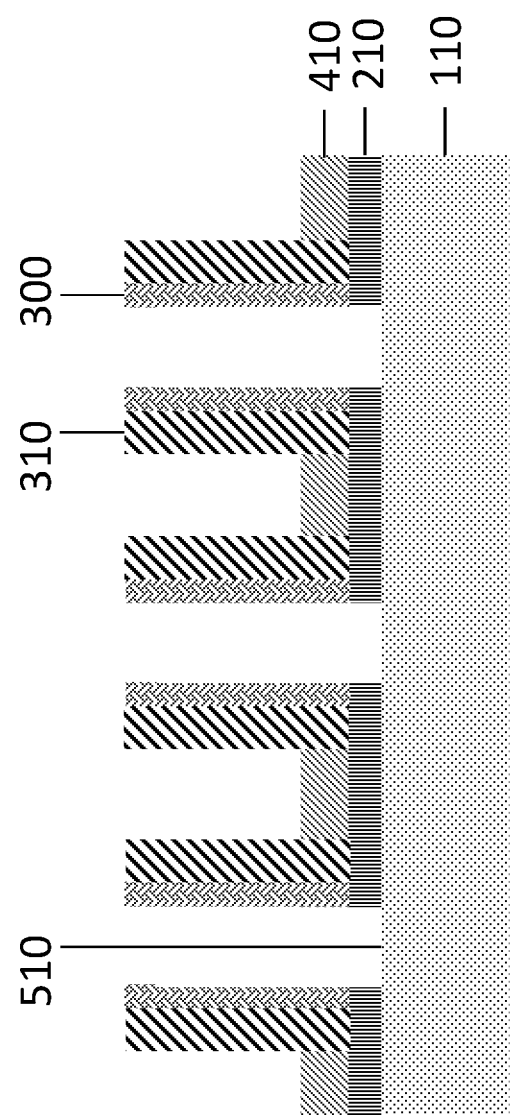
FIG. 5 shows the structure of FIG. 4 after removal of the mandrel and mask.

After formation of the first isolation layer the mask 100 and the mandrel 120 are removed. The mask and mandrel can be removed in sequential processes or in the same process step. FIG. 5 shows the structure after removal of the mask and mandrel. FIG. 5 shows the non-continuous dielectric material 210 disposed on portions of the substrate 110 with open areas of substrate 510 between the non-continuous areas of dielectric material. The first isolation layer 410 is disposed on the remainder of the dielectric material 210 and is located adjacent to the second epitaxially formed material 310.

Figure 6:
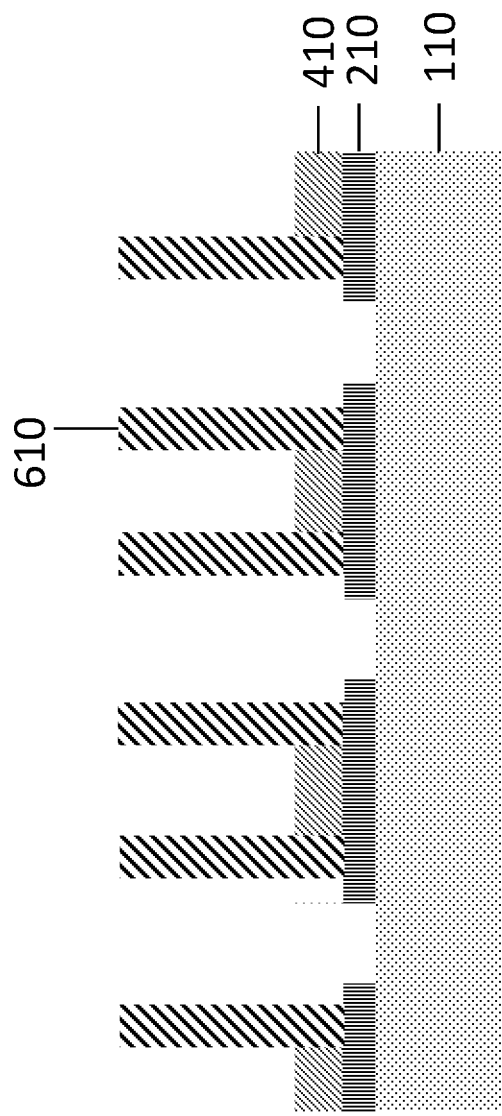
FIG. 6 shows the structure of FIG. 5 after removal of the first epitaxially formed material.

The first epitaxially formed material 300 is then removed to result in the structure shown in FIG. 6. The first epitaxially formed material can be removed by wet-etch selective to the first epitaxially formed material or digital etch to control etch rate in atomic resolution. Importantly, the removal of the first epitaxially formed material is achieved without affecting the second epitaxially formed material. The second epitaxially formed material becomes the fin 610.

Figure 7:
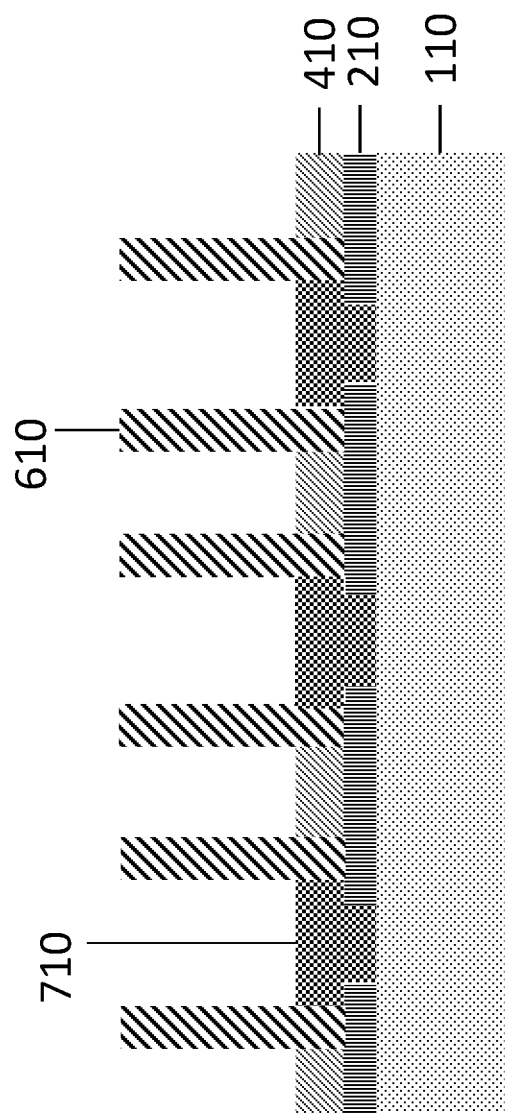
FIG. 7 shows the structure of FIG. 6 after the formation of the second isolation layer.

A second isolation material is formed over the structure of FIG. 6. The second isolation material is planarized and the material between the fins is removed to form the second isolation layer and result in the structure shown in FIG. 7. FIG. 7 shows the second isolation layer 710 disposed on top of the first isolation layer 410 and adjacent to the fins 610.

Exemplary second isolation layer materials include, but are not limited to, spin-on glass, oxides, nitrides, oxynitrides, silicates (e.g., metal silicates), aluminates, titanates, nitrides, or any combination thereof. More specific examples of dielectric materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof.

The first isolation layer, second isolation layer and the dielectric material can comprise the same or different materials. In some embodiments the first isolation layer and the second isolation layer comprise the same material which is different from the dielectric material. In some embodiments the first isolation layer and the dielectric material comprise the same material which is different from the second isolation layer. In some embodiments the second isolation layer and the dielectric material comprise the same material which is different from the first isolation layer. In some embodiments the dielectric material, first isolation layer and second isolation layer each comprise different materials. In some embodiments the dielectric material, first isolation layer and second isolation layer each comprise the same material.

The structure of FIG. 7 can then be used to form a completed semiconductor device as shown in FIG. 8.

It is also contemplated that the first epitaxially formed material can be removed immediately prior to gate dielectric deposition and source/drain epitaxial growth.

A completed semiconductor device is shown in FIG. 8. FIG. 8 is a transverse view along fin 610. Source and drain regions 810 flank the gate stacks 820 over the channel regions of the fin 610. The gate stacks 820 are capped with a capping layer.

The gate stacks 820 include high-k metal gates formed, for example, by filling a dummy gate opening (not shown) with one or more high-k dielectric materials, one or more workfunction metals, and one or more metal gate conductor materials. The high-k dielectric material(s) can be a dielectric material having a dielectric constant greater than 4.0, 7.0 or 10.0. Non-limiting examples of suitable materials for the high-k dielectric material include oxides, nitrides, oxynitrides, silicates (e.g., metal silicates), aluminates, titanates, nitrides or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between the NFET and the PFET. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, chemical mechanical planarization (CMP), is performed to polish the surface of the conductive gate metal.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of making a dual isolation fin comprising:
applying a mask to portions of a substrate and etching exposed areas of the substrate to form a mandrel;
forming a dielectric layer disposed on a surface of the substrate and adjacent to the mandrel;
forming a first epitaxially formed material on an exposed portion of the mandrel;
forming a second epitaxially formed material on the first epitaxially formed material;
forming a first isolation layer on the dielectric layer and adjacent to the second epitaxially formed material;
removing the mask and mandrel after forming the first isolation layer to form an open area of the substrate;
removing the first epitaxially formed material after removing the mask and mandrel; and
forming a second isolation layer in the open area of the substrate.

2. The method of claim 1, wherein the substrate comprises silicon.

3. The method of claim 1, wherein the mandrel has a height of 50 to 200 nanometers.

4. The method of claim 1, wherein the dielectric layer has a thickness of 30 to 100 nanometers.

5. The method of claim 1, wherein the first epitaxially formed material has a lattice constant intermediate to the second epitaxially formed material lattice constant and the mandrel lattice constant.

6. The method of claim 1, wherein the second epitaxially formed material has a thickness less than or equal to 30 nanometers.

7. The method of claim 1, wherein the second epitaxially formed material has a thickness of 3 to 10 nanometers.

8. The method of claim 1, wherein the first isolation layer has a thickness less than a height of the second epitaxially formed material.

9. The method of claim 1, wherein the first isolation layer has a thickness equal to a height of the second epitaxially formed material.

10. The method of claim 1, wherein the first isolation layer and the dielectric layer comprise a same material.

11. A method of making a dual isolation fin comprising:
applying a mask to portions of a substrate comprising silicon and etching exposed areas of the substrate to form a mandrel;
forming a dielectric layer disposed on a surface of the substrate and adjacent to the mandrel;
forming a first epitaxially formed material comprising a first III-V material on exposed portions of the mandrel;
forming a second epitaxially formed material comprising a second III-V material on the first epitaxially formed material;
forming a first isolation layer on top of the dielectric layer and adjacent to the second epitaxially formed material;
removing the mask and mandrel after forming the first isolation layer to form an open area of the substrate;
removing the first epitaxially formed material after removing the mask and mandrel; and
forming a second isolation layer in the open area of the substrate wherein the first III-V material has a lattice constant greater than a lattice constant of silicon and less than a lattice constant of the second III-V material.

12. The method of claim 11, wherein the mandrel has a height of 50 to 200 nanometers.

13. The method of claim 11, wherein the dielectric layer has a thickness of 30 to 100 nanometers.

14. The method of claim 11, wherein the second epitaxially formed material has a thickness of 3 to 10 nanometers.

15. The method of claim 11, wherein the second epitaxially formed material has a thickness less than or equal to 30 nanometers.

16. The method of claim 11, wherein the first isolation layer and the dielectric layer comprise a same material.

* * * * *